United States Patent
Yarragunta et al.

(10) Patent No.: US 12,284,788 B2
(45) Date of Patent: *Apr. 22, 2025

(54) APPARATUS INCLUDING THERMAL MANAGEMENT MECHANISM AND METHODS OF MANUFACTURING THE SAME

(71) Applicant: Micron Technology, Inc., Boise, ID (US)

(72) Inventors: Suresh Reddy Yarragunta, Bangalore (IN); Deepu Narasimiah Subhash, Bangalore (IN)

(73) Assignee: Micron Technology, Inc., Boise, ID (US)

( * ) Notice: Subject to any disclaimer, the term of this patent is extended or adjusted under 35 U.S.C. 154(b) by 58 days.

This patent is subject to a terminal disclaimer.

(21) Appl. No.: 18/236,146

(22) Filed: Aug. 21, 2023

(65) Prior Publication Data

US 2023/0397372 A1 Dec. 7, 2023

Related U.S. Application Data

(63) Continuation of application No. 17/231,994, filed on Apr. 15, 2021, now Pat. No. 11,751,357.

(51) Int. Cl.
*H05K 7/20* (2006.01)
*G06F 1/20* (2006.01)

(52) U.S. Cl.
CPC .......... *H05K 7/20409* (2013.01); *G06F 1/20* (2013.01); *H05K 7/20009* (2013.01); *H05K 7/20436* (2013.01); *H05K 7/20509* (2013.01)

(58) Field of Classification Search
CPC .......... H05K 7/20009; H05K 7/20409; H05K 7/20436; H05K 7/20509; G06F 1/20
See application file for complete search history.

(56) References Cited

U.S. PATENT DOCUMENTS

| | | | |
|---|---|---|---|
| 5,910,884 A * | 6/1999 | Garza | G06F 1/20 361/720 |
| 8,081,465 B2 * | 12/2011 | Nishiura | H01L 23/3735 361/689 |
| 10,219,365 B1 * | 2/2019 | Chen | H01L 23/3672 |
| 11,006,523 B1 * | 5/2021 | Vinciarelli | B23K 1/20 |
| 2017/0273218 A1 * | 9/2017 | Stoermer | H01L 23/3675 |
| 2022/0338378 A1 | 10/2022 | Yarragunta et al. | |

* cited by examiner

*Primary Examiner* — Mukundbhai G Patel
(74) *Attorney, Agent, or Firm* — Perkins Coie LLP (57) ABSTRACT

An apparatus including a heat sink having two or more sections of parallel fins that define colinear channels is disclosed herein. The colinear channels are configured to direct flow of air or coolant across the heat sink and have wider channel widths closer to an inlet for the air or coolant and narrower widths closer to an outlet for the air or coolant.

20 Claims, 9 Drawing Sheets

FIG. 5

APPARATUS INCLUDING THERMAL MANAGEMENT MECHANISM AND METHODS OF MANUFACTURING THE SAME

CROSS-REFERENCE TO RELATED APPLICATION(S)

This application is a continuation of U.S. application Ser. No. 17/231,994, filed Apr. 15, 2021, which is incorporated herein by reference in its entirety.

TECHNICAL FIELD

The present technology is directed to apparatuses, such as electronic circuit cards including memory and processors, and several embodiments are directed to apparatuses that include thermal management mechanisms.

BACKGROUND

The current trend in electronics fabrication is to manufacture smaller and faster devices with a higher density of components for computers, servers, personal devices, and many other products. However, the increase in component density and performance levels can lead to increase in the heat generated/retained by the devices. Additionally, the component placements can hinder air flow through or over the device and reduce the thermal dissipation of the device.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with electronic devices are not shown, or are not described in detail, to avoid obscuring other aspects of the technology. In general, it should be understood that various other devices, systems, and methods in addition to those specific embodiments disclosed herein may be within the scope of the present technology.

Several embodiments of electronic apparatuses, devices, and/or systems devices, packages, and/or assemblies in accordance with the present technology can include a thermal management mechanism (e.g., a heat sink device) directly providing dissipation channels with different/varying channel widths. The thermal management mechanism can include a base portion having depressions/shapes configured to accommodate component heights. Accordingly, the thermal management mechanism can directly contact multiple corresponding components of the apparatus. The thermal management mechanism can include dissipation fins attached to/integral with the base portion opposite the components. The dissipation fins can extend away from the components, and distal end portions of the dissipation fins can extend to and be coplanar with a common reference plane. The distal end portions can be attached to/integral with a thermally-conductive cover. In some embodiments, the dissipation fins can be parallel to each other and/or have varying densities for improving thermal performance of the corresponding components.

The dissipation fins and/or the thermal cover can form dissipation channels configured to increase airflow through the electronic device. In some embodiments, the dissipation fins can correspond to different sections, and the dissipation channels can have different widths that correspond to the sections. The widths of the dissipation channels can be configured to increase the air flow and/or reduce the pressure drop/difference in comparison to environments external to the electronic device. For example, channels can have wider widths closer to a coolant (e.g., air or other fluid) inlet and narrower widths closer to an outlet for the same to ensure isothermal heat transfer surfaces. Accordingly, the thermal management mechanism can increase the thermal energy removed from the electronic components, thereby increase device/component longevity, increase performance, increase heat-related limitations, and/or decrease noise-related errors. The thermal management mechanism can be economical and robust in design and can replace other advanced or costlier cooling solutions (e.g., liquid-based cooling system).

Figure 1A:
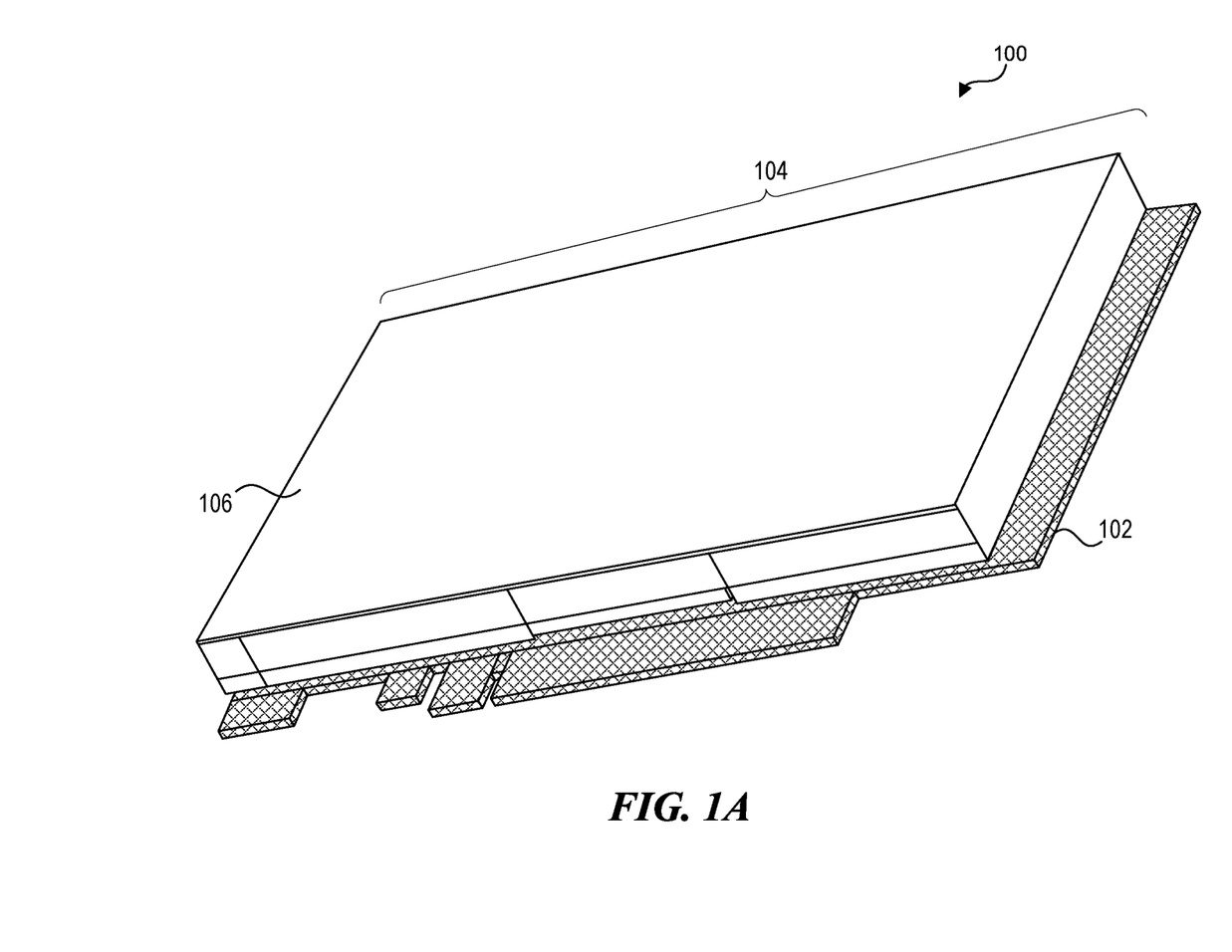
FIG. 1A is a perspective view of an apparatus.
Figure 1B:
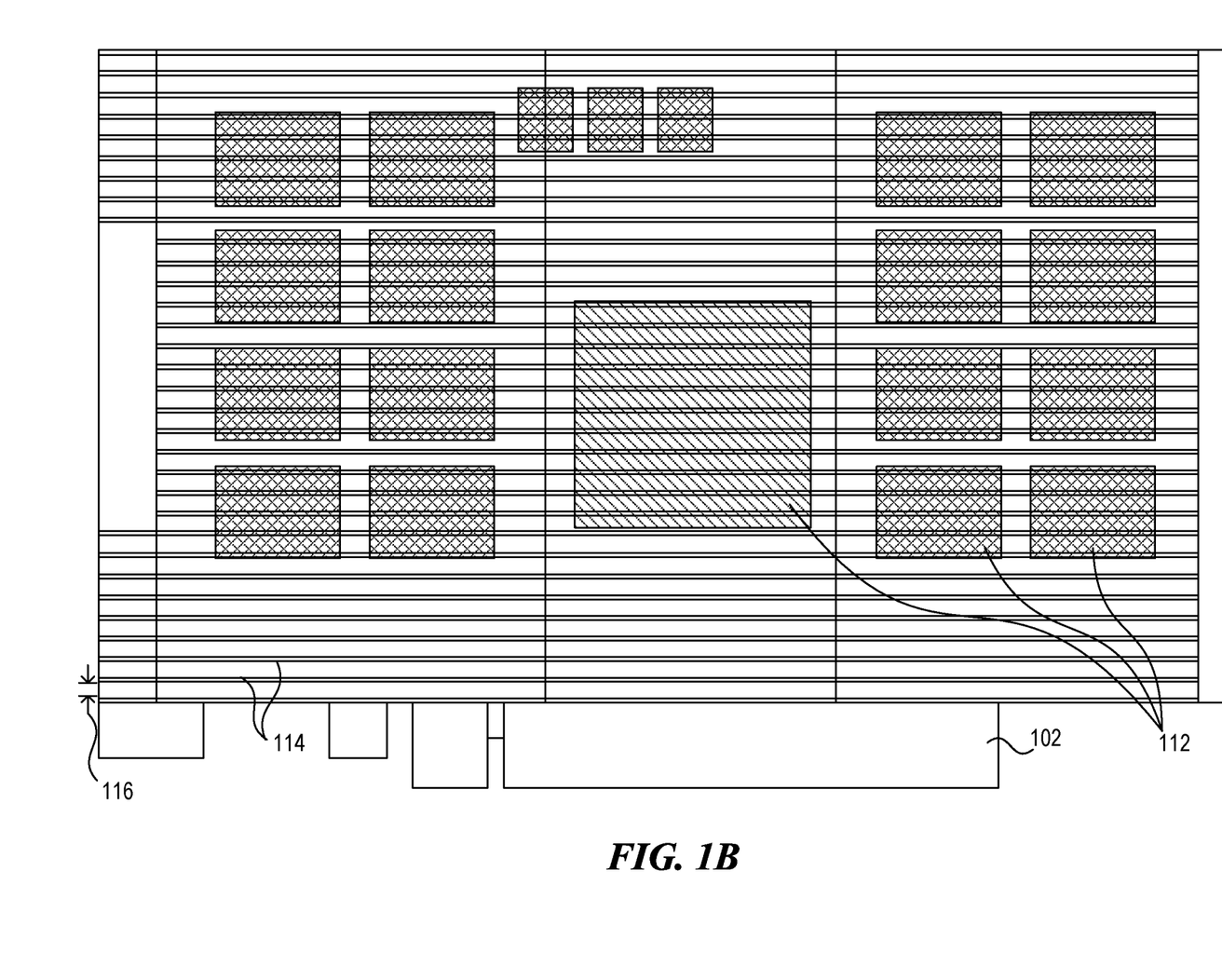
FIG. 1B is a schematic plan view of the apparatus of FIG. 1A.

FIG. 1A is a top view of an apparatus 100, and FIG. 1B is a schematic plan view of the apparatus 100 of FIG. 1A. Referring to FIG. 1A and FIG. 1B together, the apparatus 100 can include an electronic device, such as a circuit card, a server blade, or the like. For example, the apparatus 100 can include a Peripheral Component Interconnect Express (PCIe) add-in card used in datacenter applications. The PCIe add-in card may include media components (e.g., graphics processing circuits) and/or be configured to provide performance and/or functionalities that exceed a performance threshold (e.g., for high performance devices).

The apparatus 100 can include a substrate 102 (e.g., a Printed Circuit Boards (PCB)) having electronic components 112 (e.g., active/passive circuit components, semiconductor devices/assemblies, or the like) attached thereon. The substrate 102 can further provide electrical connections between the electronic components 112 and/or electrical connections between the apparatus 100 and one or more external devices (e.g., the datacenter devices). The apparatus 100 can include an encasing 104 over the substrate 102 and covering the electronic components 112. The encasing 104 can include an encasing cover 106 over the substrate 102 and the electronic components 112. The encasing 104 and the cover 106 can be configured to provide physical and/or electrical protection for the components. Accordingly, the encasing 104 and the cover 106 can include electrically insulative material (e.g., polymer, plastic, etc.). The encasing 104 and the cover 106 can include material that is not configured to conduct/dissipate thermal energy.

The apparatus 100 may include one or more heat sinks 114 thermally coupled to the electronic components 112. The heat sinks 114 can have dissipation fins that extend above and away from the electronic components 112. The dissipation fins can be thermally and/or physically separated from the encasing cover 106.

The heat sinks 114 can be configured to remove the thermal energy from the electronic components 112 and dissipate the energy into the surrounding environment, such as via the dissipation fins. In some embodiments, the dissipation fins can be arranged parallel to each other and linearly extend from one end of the substrate 102 to an opposing end thereof. The dissipation fins can be uniformly spaced apart such that the space defined by the fins can have the same widths 116. The spacing between the dissipation fins can function as channels for air flow when the opposing ends of the apparatus 100 have openings.

Figure 2A:
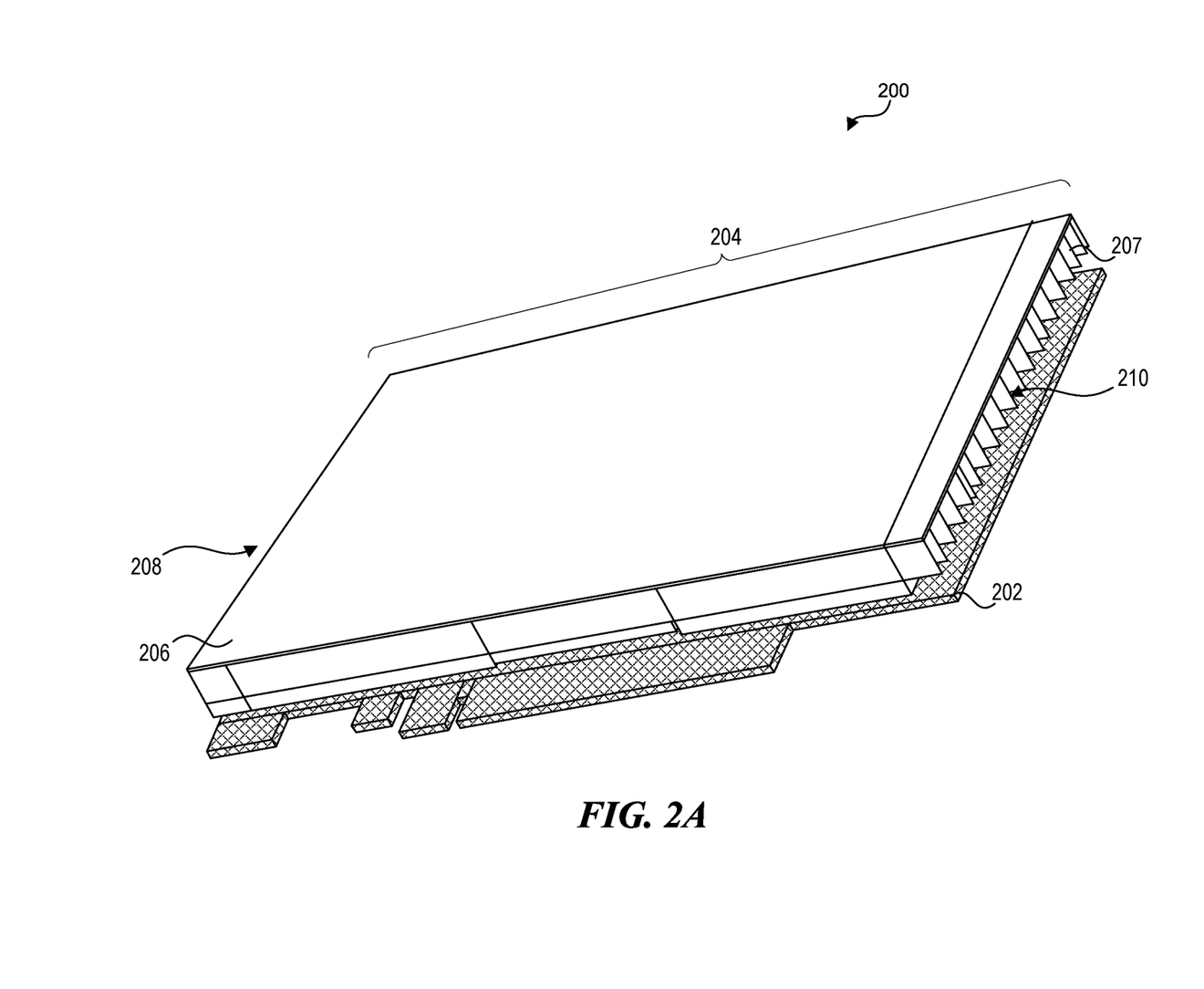
FIG. 2A is a perspective view of an apparatus in accordance with embodiments of the technology.
Figure 2B:
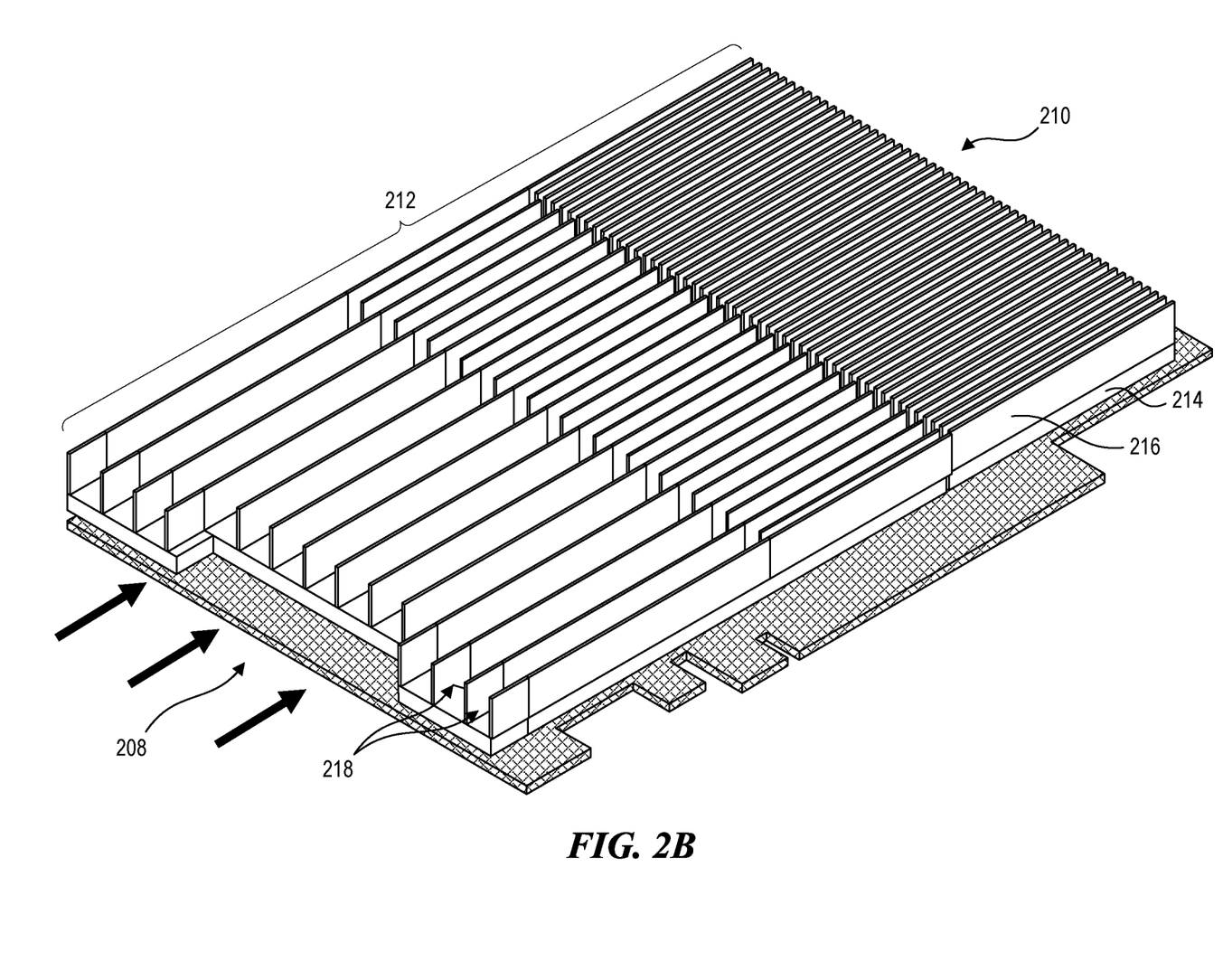
FIG. 2B is a perspective view of a thermal management mechanism for the apparatus in accordance with embodiments of the technology.
Figure 2C:
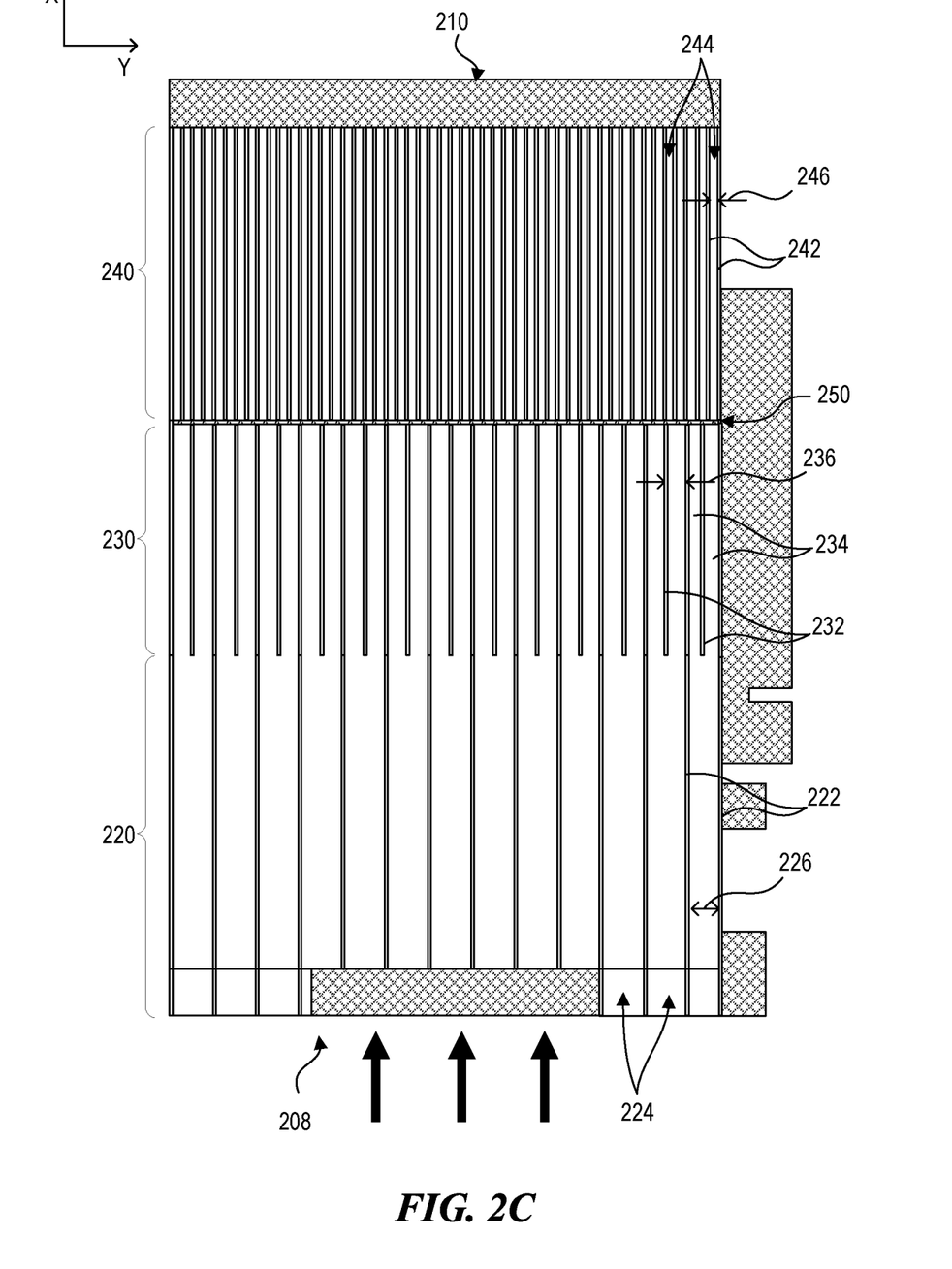
FIG. 2C is a top view of the thermal management mechanism in accordance with embodiments of the technology.
Figure 2D:
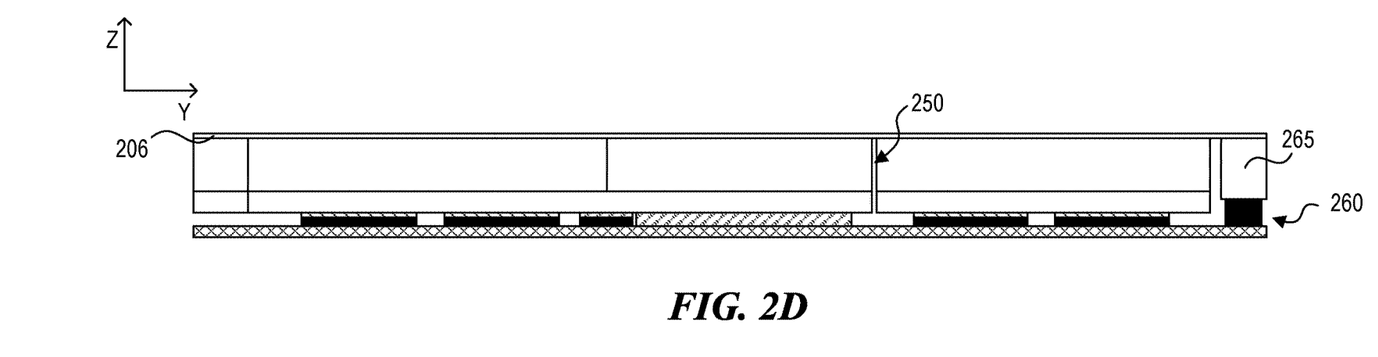
FIG. 2D is a side view of the apparatus in accordance with embodiments of the technology.
Figure 2E:
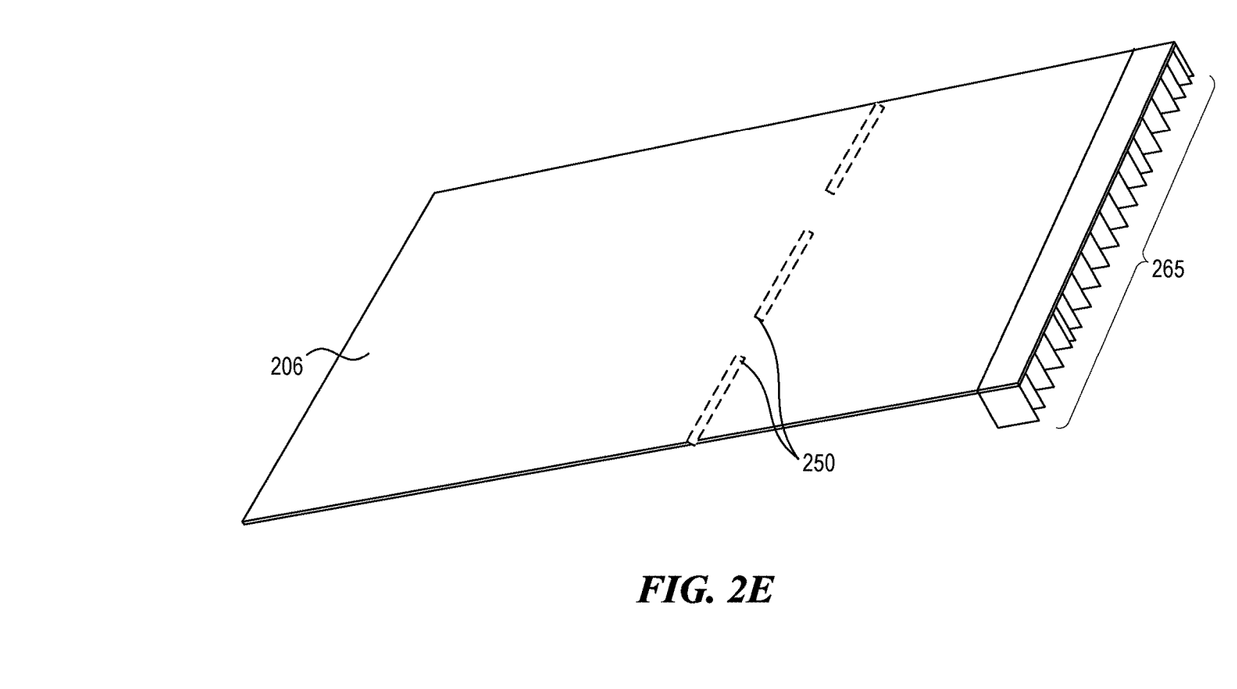
FIG. 2E is a perspective view of a thermal management cover in accordance with embodiments of the technology.

FIG. 2A is a perspective view of an apparatus 200 in accordance with embodiments of the technology. FIG. 2B is a perspective view of a thermal management mechanism 212 (e.g., a heat sink device) for the apparatus 200 in accordance with embodiments of the technology. The apparatus 200 can include the thermal management mechanism 212, and FIG. 2B can correspond to a perspective view the apparatus 200 with a thermal encasing 204 or a thermal cover 206 removed. FIG. 2C is a top view of the thermal management mechanism 212 in accordance with embodiments of the technology. FIG. 2D is a side view of the apparatus 200 in accordance with embodiments of the technology. FIG. 2D may illustrate the apparatus 200 with one or more sidewalls removed. FIG. 2E is a perspective view of a thermal management cover (e.g., the thermal cover 206) in accordance with embodiments of the technology.

Referring to FIGS. 2A-2E together, the apparatus 200 can include an electronic device, such as a circuit card, a server blade, or the like. For example, the apparatus 200 can include a Peripheral Component Interconnect Express (PCIe) add-in card used in datacenter applications. The PCIe add-in card may include media components (e.g., graphics processing circuits) and/or be configured to provide performance and/or functionalities that exceed a performance threshold (e.g., for high performance devices).

The apparatus 200 can include a substrate 202 (e.g., a Printed Circuit Boards (PCB)) having electronic components 260 (e.g., active/passive circuit components, semiconductor devices/assemblies, or the like) attached thereon. The substrate 202 can further provide electrical connections between the electronic components 260 and/or electrical connections between the apparatus 200 and one or more external devices (e.g., the datacenter devices).

The apparatus 200 can include the thermal encasing 204 over the substrate 202 and covering the electronic components 260. The encasing 204 can include the thermal cover 206 over the substrate 202 and the electronic components 260. The thermal encasing 204 and the thermal cover 206 can be configured to provide physical and/or electrical protection for the components. The thermal encasing 204 and the thermal cover 206 can further be configured to dissipate thermal energy away from the electronic components 260. Accordingly, the thermal encasing 204 and the thermal cover 206 can include material (e.g., metallic material) that is configured to conduct/dissipate thermal energy.

The apparatus 200 may include a first opening 208 and/or a second opening 210. The second opening 210 can be located opposite the first opening 208. In some embodiments, the first opening 208 can function as an inlet for a fluid (e.g., air or other coolants), and the second opening 210 can function as an outlet for the fluid. For example, the apparatus 200 can be configured to allow air to enter through the first opening 208 and out through the second opening 210.

The apparatus 200 can include the thermal management mechanism 212 (e.g., one or more heat sinks) thermally coupled to the electronic components 112 and/or the thermal encasing 204 (e.g., the sidewalls and/or the thermal cover 206). For example, the thermal management mechanism 212 can include one or more thermal base structures 214 (e.g., one or more solid metallic structures) configured to draw thermal energy away from the electronic components 260 (e.g., along a vertical/z direction as shown in FIG. 2D) and/or transfer the thermal energy along directions (e.g. along lateral directions as shown in FIG. 2D) orthogonal to the removal direction. The thermal management mechanism 212 can include one or more sets of dissipation fins 216 that form or define corresponding sets of dissipation channels 218. As described in detail below, the thermal management mechanism 210 can be configured to control and facilitate the fluid flow between the first opening 208 and the second opening 210. For example, the dissipation fins 216 can extend away from the thermal base 214 (e.g., orthogonal to the planar shape/surface of the base and/or vertically along a Z axis) and toward the thermal cover 206. The dissipation fins 216 can also extend from the first opening 208 to the second opening 210 (e.g., laterally along a y direction matching the direction of fluid/coolant flow). The dissipation fins 216 may be arranged parallel to each other and form the dissipation channels 218 between adjacent dissipation fins 216. Accordingly, the dissipation channels 218 can (1) extend from the first opening 208 to the second opening 210 (e.g., along the direction of fluid/coolant flow) and/or (2) be arranged parallel to each other.

The dissipation fins 216 can be arranged according to one or more widths (e.g., channel widths measured along an x direction orthogonal to the lateral extension of the fins). For the example illustrated in FIG. 2C, the dissipation fins 216 can be arranged according to sections (e.g., a first section 220, a second section 230, and/or a third section 240). The dissipation fins 216 for each section can be arranged according to a corresponding channel width. For example, the first section 220 can include a first set of fins ("first fins") 222 separated by a first width 226, thereby forming a first set of channels ("first channels") 224 each having the first width 226. The first fins 222 can extend into and/or across the second section 230. The second section 230 can include a second set of fins ("second fins") 232 located between the first fins 222. The first fins 222 and the second fins 232 can form a second set of channels ("second channels") 234 each having a second width 236. The third section 240 can include a third set of fins ("third fins") 242 forming a third set of channels ("third channels") 244 each having a third width 246. In some embodiments, the first width 226, the second width 236, and/or the third width 246 can be different from each other. For example, the third width 246 can be less than the second width 236 and/or the second width 236 can be less than the first width 226.

In some embodiments, the channel widths can sequentially lessen or become narrower from the first opening 208 to the second opening 210 (e.g., along the direction of fluid flow). The sections/fin arrangements of the thermal management mechanism 212 can be configured to decrease pressure differences between inside and outside of the apparatus 200 (e.g., the overall pressure drop between spaces inside the PCIe card and the encompassing system). Accordingly, the thermal management mechanism 212 can improve the flow of air/coolant through the apparatus 200 and the corresponding cooling of the electronic components 260. Additionally or alternatively, the sections/fin arrangements of the thermal management mechanism 212 can be further configured to increase cooling of the electronic components 260 based on thermally coupling the denser fins (e.g., the section having the narrower channel widths, such as the third section 240) directly or closer to portions of the electronic components 260 that generate greater heat. For example, the greater density in the fins can provide higher flow impedance and/or larger fin surface area for heat exchange appropriate for the warmer circuit components. Comparatively, the lower density in the fins (e.g., greater channel widths, such as the first section 220) provide lower/negligible flow impedance to allow free flow of air/coolant to the denser sections and have lower fin surface areas appropriate/sufficient for the cooler circuit components. The gradual increase of flow impedance along the flow direction can provide isothermal heatsink base that can further improve the thermal performance of the thermal management mechanism 212 and the apparatus 200.

The thermal management mechanism 212 can be thermally coupled to the thermal encasing 204. For example, the dissipation fins 216 can be thermally coupled to the thermal cover 206 (via, e.g., direct contact and/or thermal paste) and/or the thermal base 214 to the side walls of the thermal encasing 204. The thermal cover 206 can provide a cover for the dissipation fins 216 and form a channel/conduit for the air/coolant flow. Accordingly, the thermal cover 206 can improve channelization of the coolant flow and reduce flow bypass. Moreover, the thermal encasing 204 can further conduct and dissipate thermal energy away from the thermal management mechanism 212 and the electronic components 260.

In some embodiments, the third section 240 can include one or more structures separate and/or disconnected from corresponding structures in the second section 230. For example, the third section 240 can include the third fins 242 separate/disconnected from the first fins 222 and/or the second fins 232 to form a section separation 250. Alternatively or additionally, the section separation 250 can correspond to separations and/or openings in or between the corresponding sections of the thermal base 214 and/or the thermal cover 206. The thermal management mechanism 212 can be configured to control/limit exchange of thermal energy between sections according to the section separation 250.

The thermal management mechanism 212 can be configured to remove thermal energy from the electronic components 260 through a thermal coupling (via, e.g., direct contact or thermal adhesive) between the electronic components 260 and the thermal base 214. In some embodiments, one or more portions of the thermal management mechanism 212 (e.g., the thermal base 214) can extend below top surfaces of one or more electronic components 260. Alternatively or additionally, the thermal base 214 can be thermally coupled to peripheral portions of one or more electronic components 260.

In some embodiments, the thermal management mechanism 212 can include cover dissipators 265 directly attached to the thermal cover 206. The cover dissipators 265 can extend from the thermal cover 206 toward the substrate 202. The cover dissipators 265 can be configured to dissipate heat away from the thermal cover 206. Additionally, the cover dissipators 265 can be configured to remove heat away from one or more components directly below. For example, the cover dissipators 265 can have a vertical dimension less than that of the dissipation fins 216 to accommodate taller components. The cover dissipators 265 may be thermally coupled to the taller components. Further, the cover dissipators 265 may have a shape similar to the dissipation fins 216 and/or have a shorter lateral length than the dissipation fins 216. The cover dissipators 265 can separated from the dissipation fins 216.

Figure 3A:
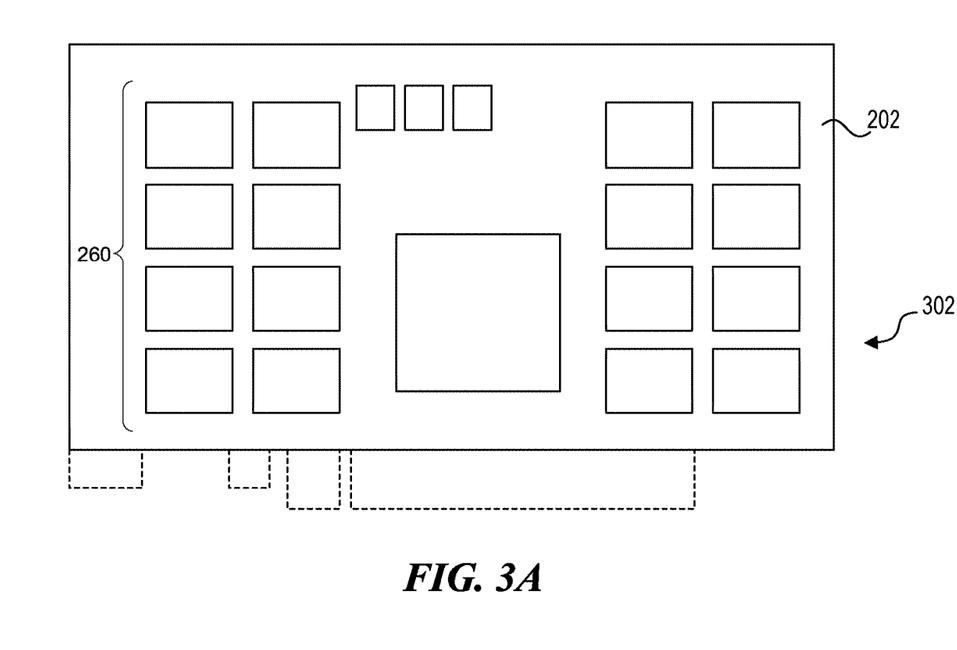
FIG. 3A is an illustration of a component placement profile in accordance with embodiments of the technology.
Figure 3B:
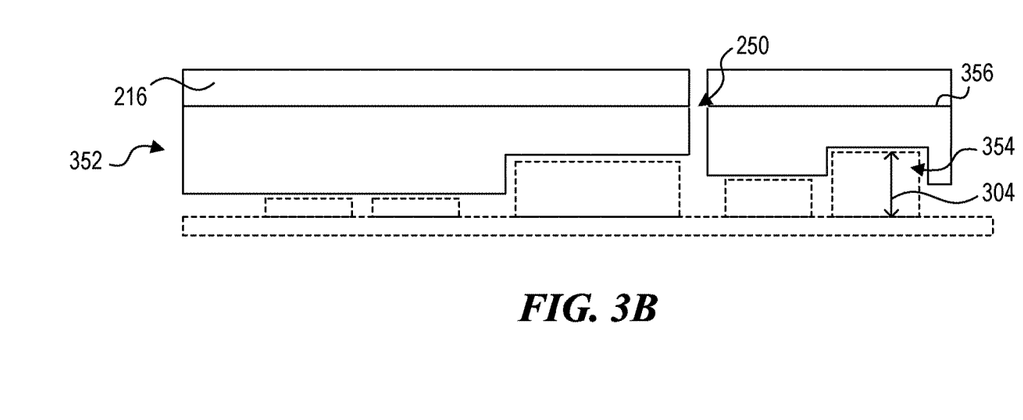
FIG. 3B is an illustration of a fin shape profile in accordance with embodiments of the technology.

FIG. 3A is an illustration of a component placement profile 302, and FIG. 3B is an illustration of a base contact profile 352. Referring to FIG. 3A and FIG. 3B together, the component placement profile 302 can represent an arrangement of the electronic components 260 on the substrate 202. For example, the placement profile 302 can represent locations of the electronic components 260 on the substrate 202 and/or corresponding component heights 304. A circuit designer and/or manufacturer may design or generate the component placement profile 302 according to the overall requirement for the electronic components 260 and/or thermal characteristics of thereof.

The circuit designer and/or manufacturer may also design or generate the base contact profile 352 based on or along with the component placement profile 302. The base contact profile 352 can represent shapes and/or corresponding dimensions for the thermal base 214. For example, the base contact profile 352 can describe locations, shapes, and/or dimensions for component depressions 354 in the thermal base 214. The component depressions 354 can be configured to accommodate the electronic components 260. In other words, the component depressions 354 can have depths that correspond to the component heights 304 of the corresponding component. Accordingly, the thermal base 214 can cover and be thermally coupled to multiple components that have different heights. Moreover, the thermal base 214 can have one or more coplanar/continuous top portions 356 that are connected to or integral with the dissipation fins 216. In some embodiments, the thermal base 214 can include multiple separated portions, such as a first portion that corresponds to the first section 220 of FIG. 2C and the second section 230 of FIG. 2C and a second portion that corresponds to the third section 240 of FIG. 2C. The multiple portions can correspond to the section separation 250.

Figure 4:
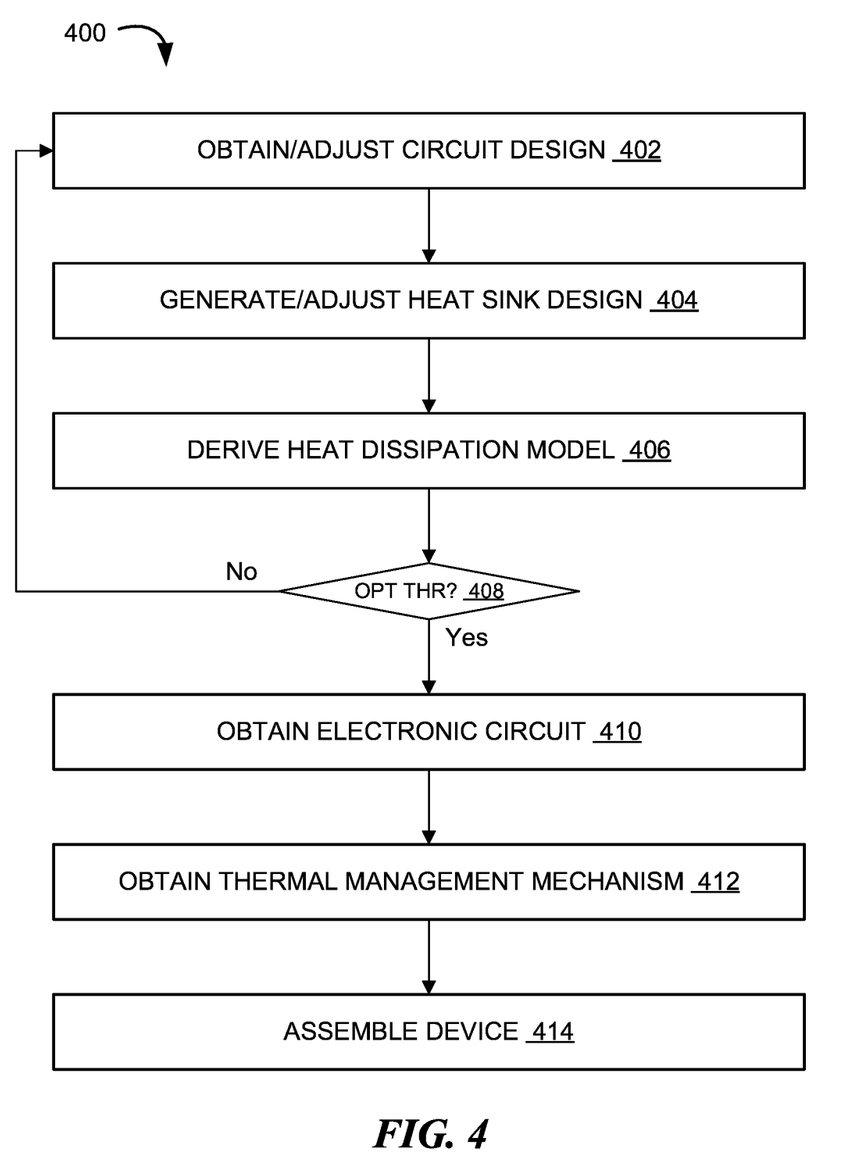
FIG. 4 is a is a flow diagram illustrating an example method of manufacturing an apparatus in accordance with an embodiment of the present technology.

FIG. 4 is a is a flow diagram illustrating an example method 400 of manufacturing an apparatus (e.g., the apparatus 200 of FIG. 2A and/or the thermal management mechanism 212 of FIG. 2B) in accordance with an embodiment of the present technology. The method 400 can include obtaining/generating the component placement profile 302 of FIG. 3A and/or the base contact profile 352 of FIG. 3B. Alternatively or additionally, the method 400 can include forming or providing the thermal management mechanism 212 and/or the apparatus 200.

At block 402, the method 400 can include obtaining a circuit design (e.g., the component placement profile 302 of FIG. 3A). In some embodiments, obtaining the circuit design can include obtaining a list of the electronic components 260 of FIG. 2D, an electrical connection between the components, and/or placement locations thereof on the substrate of FIG. 2A provided by a supplier, a circuit designer, a manufacturer, etc. In other embodiments, obtaining the circuit design can include generating the component placement profile 302 (e.g., locations of the components on the substrate) based on the obtained listing of components and connection requirements.

As an illustrative example, the circuit design can be generated using a predetermined mechanism (e.g., a design software, a set of rules, etc.). The input to the design mechanism can correspond to the list of components, the connection requirements between the components, the size/characteristic of the substrate 202, or a combination thereof. Based on the input, a computing system and/or a designer can generate one or more sets of component placement locations on the substrate 202 (e.g., instances of the component placement profile 302) according to a predetermined routine/rules.

At block 404, the method 400 can include generating a heat sink design. For example, generating the heat sink design can include deriving the base contact profile 352 of FIG. 3B according to the component placement profile 302. Also, generating the heat sink design can include deriving lengths of the section fins (e.g., locations dividing the different sections) and/or widths of the channels (e.g., separation between the fins for each section).

As an illustrative example, the heat sink design can be generated using a predetermined mechanism (e.g., a design software, a set of rules, etc.). The input to the design mechanism can include the component placement profile 302, the thermal characteristics of the electronic components 260, the thermal characteristics/requirements of the encompassing system, or a combination thereof. Generating the heat sink design can include deriving the locations of the component depressions 354 of FIG. 3B and/or deriving sizes/locations of the sections (e.g., the first section 220 of FIG. 2C, the second section 230 of FIG. 2C, the third section 240 of FIG. 2C, corresponding fin lengths, corresponding channel widths, etc.).

At block 406, the method 400 can include deriving a heat dissipation model for the designed circuit and/or the heat sink design. For example, a computing system and/or a designer can use the design results as inputs along with system characteristics (e.g., expected location of the apparatus 200 within the system, expected internal coolant flow pattern, coolant driver/fan, etc.). The heat dissipation model can be derived based on predetermined rules/patterns that characterize thermodynamics and/or heat transfer between matters.

In some embodiments, the circuit designs and/or the heat sink design can be generated and adjusted iteratively until the combination of the circuit and the heat sink satisfies one or more conditions that represent thermal optimization conditions (e.g., maximizing heat removal from the electronic components 260). For example, the designer system can generate an initial design for the circuit and/or the heat sink device. The designer system can generate the corresponding heat dissipation model as described above. At decision block 408, the designer system compare the heat dissipation model to the predetermined thresholds representative of thermal optimization. When the heat dissipation model does not satisfy the optimization thresholds, the designer system can adjust the circuit and/or the heat sink according to a predetermined pattern/rule and repeat the analysis. Accordingly, the designer system can derive the circuit/heat sink design that reduces and/or minimizes the operating temperatures of the electronic components 260.

When the design(s) satisfy the predetermined thresholds, the method 400 can proceed to obtaining the electronic circuit as illustrated in block 410. The electronic circuit can be obtained with the electronic components 260 arranged and connected on the substrate 202 according to the component placement profile 302. In some embodiments, the electronic circuit can be obtained by manufacturing the substrate 202 with the mounting locations and/or traces and attaching the electronic components 260 according to the component placement profile 302.

At block 412, the method 400 can include obtaining the thermal management mechanism 212 of FIG. 2B. Obtaining the thermal management mechanism 212 can include manufacturing the thermal management mechanism 212 (e.g., the heat sink) according to the heat sink design. For example, the thermal base 214 can be manufactured with the component depressions 354 according to the base contact profile 352. Also, the dissipation fins 216 of FIG. 2B can be arranged on the thermal base 214 according to the lengths, the section locations, and/or the channel widths described above.

At block 414, the method 400 can include assembling the device (e.g., the apparatus 200 of FIG. 2A). The device can be assembled by attaching and/or thermally coupling the thermal management mechanism 212 to the electronic components 260. The attached combination of the thermal management mechanism 212 and the electronic components 260 can be encased in the thermal encasing 204 of FIG. 2A. In encasing the circuit, the thermal cover 206 of FIG. 2A can be attached to and/or thermally coupled to the dissipation fins 216.

Figure 5:
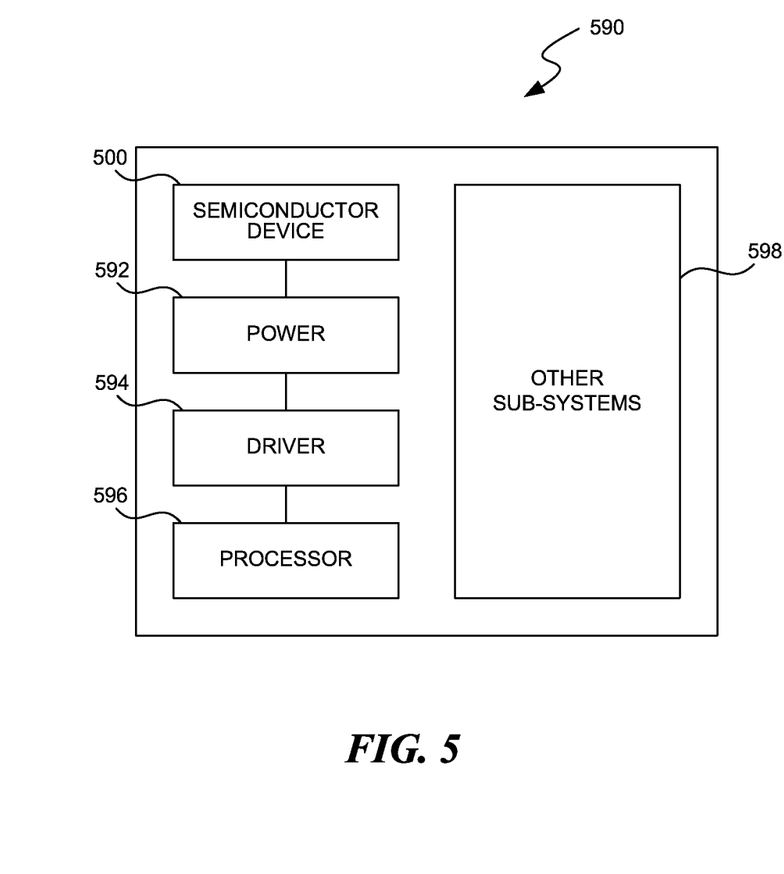
FIG. 5 is a schematic view of a system that includes an apparatus configured in accordance with embodiments of the present technology.

FIG. 5 is a schematic view of a system that includes an apparatus in accordance with embodiments of the present technology. Any one of the semiconductor devices described above with reference to FIGS. 1A-4 can be incorporated into any of a myriad of larger and/or more complex systems, a representative example of which is system 590 (e.g., a server, a data room, or the like) shown schematically in FIG. 5. The system 590 can include an electronic device 500 ("device 500") (e.g., the apparatus 200 of FIG. 2, such as the PCIe card), a power source 592, a driver 594, a processor 596, and/or other subsystems or components 598. The device 500 can include features generally similar to those devices described above. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, and appliances. Components of the system 590 may be housed in a single unit or distributed over multiple, interconnected units (e.g., through a communications network). The components of the system 590 can also include remote devices and any of a wide variety of computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," and "having" are used throughout to mean including at least the recited feature(s) such that any greater number of the same feature and/or additional types of other features are not precluded. Reference herein to "one embodiment," "an embodiment," "some embodiments" or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

What is claimed is:

1. An apparatus, comprising:
   a substrate;
   a set of electronic components attached over the substrate;
   a heat sink attached to the set of electronic components and configured to remove thermal energy away from the set of electronic components, wherein the heat sink includes—
     a base portion attached to and thermally conductive with the set of electronic components, the base portion having a planar surface opposite the set of electronic components and extending from a first edge to an opposite second edge, and
     a set of fins extending (1) perpendicularly away from the planar surface of the base portion (2) along or parallel to a lateral direction extending between the first edge and the second edge; and
   a top cover thermally coupled to the set of fins, the top cover having dissipation fins that are (1) attached to or integral with the top cover and (2) located closer to the second peripheral edge than the first peripheral edge along the flow direction.

2. The apparatus of claim 1, wherein:
   the first edge corresponds to an inlet for receiving a cooling fluid or air;
   the second edge corresponds to an outlet for outputting the cooling fluid or air that has traversed along the lateral direction; and
   the set of fins define (1) a first set of flow channels adjacent to the first edge and having a first width and (2) a second set of flow channels having a second width and located between the first set of flow channels and the second edge,
     wherein the second width is different from the first width, and
     wherein the second set of flow channels parallel to and/or colinear with the first set of flow channels.

3. The apparatus of claim 1, wherein:
   the base portion includes:
     a first base portion adjacent to or defining the first edge, wherein the first base segment defines lower boundaries for the first set of flow channels; and
     a second base portion (1) located between the first base and adjacent to or defining the second edge and (2) physically separate from the first base segment; and
   the set of fins define (1) a first set of flow channels over the first base portion and (2) a second set of flow channels over the second base portion.

4. The apparatus of claim 1, wherein the set of fins include:
   first fins defining a first set of flow channels; and
   second fins defining a second set of flow channels, wherein at least a subset of the second fins are (1) colinear with the first fins for channeling flow of a cooling fluid or air from the first set of flow channels to the second set of flow channels and (2) physically separate from the first fins for limiting transfer of thermal energy across the first and second fins.

5. The apparatus of claim 1, wherein:
   the base portion includes (1) a first portion defining or adjacent to the first edge and (2) a second portion defining the second edge or located between the first portion and the second edge;
   the set of fins includes:
     first fins extending (1) parallel to each other and (2) linearly over the first and second portions of the base portion, the first fins separated by a first width; and
     second fins extending (1) parallel to each other and (2) linearly over the second portion of the base portion, wherein the second fins are parallel to and located between the first fins.

6. The apparatus of claim 1, wherein the base portion includes component depressions configured to fit over one or more components in the set of electronic components, the component depressions having depths and/or shapes associated with corresponding components.

7. The apparatus of claim 1, wherein base portion includes the planar surface that extends from the first edge to the second edge.

8. The apparatus of claim 1, wherein the top cover is configured to draw thermal energy away from the set of fins.

9. The apparatus of claim 1, wherein the cover dissipation fins (1) vertically extend toward the substrate, (2) are physically separate from the set of fins, and (3) are configured to dissipate the thermal energy from the top cover.

10. The apparatus of claim 1, wherein the dissipation fins are adjacent to the second peripheral edge and configured to dissipate thermal energy away from the top cover.

11. The apparatus of claim 1, wherein the dissipation fins are over one or more components in the set of electronic components and configured to dissipate thermal energy away from the one or more components under the dissipation fins.

12. The apparatus of claim 1, wherein the dissipation fins have a height less than fin heights for the set of fins.

13. A heat removal system, comprising:
   a base portion configured to attach to a set of electronic components, the base portion having (1) a planar surface opposite the set of electronic components and (2) a first edge and an opposite second edge;

a set of fins extending upward from the planar top portions and linearly between the first and second peripheral edges;

a top cover over and thermally coupled to the set of fins, the top cover having dissipation fins that are (1) attached to or integral with the top cover, (2) extending parallel to the set of fins, and (3) located closer to the second edge than the first edge.

14. The heat removal system of claim 13, wherein the set of fins include a first set of fins configured to be located directly over a first set of components and a second set of fins configured to be located directly over a second set of components, the first set of fins arranged in parallel to each other and at least partially defining a first set of cooling channels, the second set of fins arranged in parallel to each other and at least partially defining a second set of cooling channels.

15. The heat removal system of claim 14, wherein:

the first set of fins is configured to overlap a controller, a memory, a power circuit, or a combination thereof; and the second set of fins is configured to overlap a media device, a graphics processor, or a combination thereof.

16. The heat removal system of claim 14, wherein the first set of cooling channels have a first width that is greater than a second width of the second set of cooling channels, wherein a flow direction extends from the first set of cooling channels to the second set of cooling channels.

17. A method of manufacturing an apparatus, the method comprising:

obtaining a circuit design representing an arrangement of circuit components;

according to the circuit design, designing a heat sink configured to remove thermal energy from the circuit components, wherein designing the heat sink includes:

determining a bottom surface shape for a base portion of the heat sink, wherein the bottom surface shape is configured to directly contact top portions of the arranged circuit components;

deriving widths and lengths for at least a first set of flow channels and a second set of flow channels, wherein:

the first set of flow channels are defined by a first set of fins that (1) extend parallel to each other, (2) are separated by a first width, and (3) extend a first length from a location closer to a first edge of the base portion than a second and opposite edge toward the second edge, the first edge representing an inlet for a cooling fluid or air, and the second edge representing an outlet for the cooling fluid or air, and the second set of flow channels are defined by a second set of fins that (1) extend parallel to each other and the first set of fins, (2) are separated by a second width different from the first width, and (3) extend a second length from a location between the first set of fins and the second edge toward the second edge;

deriving one or more heights for the first set of fins, the second set of fins, or a combination thereof, wherein the one or more heights are configured to thermally couple to a top cover having dissipation fins that are (1) attached or integral with the top cover and (2) located closer to the second edge than the first edge.

18. The method of claim 17, further comprising:

manufacturing the heat sink having the bottom surface shape, the first set of flow channels, and the second set of flow channels.

19. The method of claim 17, further comprising:

obtaining the circuit components arranged on a substrate according to the circuit design;

obtaining the heat sink having the bottom surface shape, the first set of flow channels, and the second set of flow channels;

attaching the heat sink over the circuit components, wherein the circuit components are thermally coupled to the heat sink according to the bottom surface shape;

obtaining the top cover; and thermally coupling one or more fins in the first set of fins, the second set of fins, or a combination thereof to the top cover.

20. The method of claim 17, wherein:

the circuit design is obtained as a result of iteratively adjusting a previous circuit arrangement according to a thermal dissipation model, a previous heat sink design, or a combination thereof;

designing the heat sink includes iteratively adjusting the previous heat sink design based on the circuit design and the thermal dissipation model; and iterative adjustments for the circuit design and the heat sink are repeated until one or more thresholds are satisfied, wherein the one or more thresholds are for reducing or minimizing operating temperatures of the components.

* * * * *